United States Patent
Cho et al.

(10) Patent No.: US 8,499,206 B2
(45) Date of Patent: Jul. 30, 2013

(54) MEMORY SYSTEM AND METHOD FOR PREVENTING SYSTEM HANG

(75) Inventors: Beom-Sig Cho, Hwaseong-si (KR); Jung-Joon Lee, Bucheon-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 368 days.

(21) Appl. No.: 12/966,171

(22) Filed: Dec. 13, 2010

(65) Prior Publication Data

US 2011/0219274 A1    Sep. 8, 2011

(30) Foreign Application Priority Data

Mar. 4, 2010 (KR) .................. 10-2010-0019483

(51) Int. Cl.
*G06F 11/00* (2006.01)

(52) U.S. Cl.
USPC .......................................... 714/708

(58) Field of Classification Search
None
See application file for complete search history.

(56) References Cited

U.S. PATENT DOCUMENTS

| 6,560,725 B1* | 5/2003 | Longwell et al. ............... 714/54 |
| 6,988,227 B1* | 1/2006 | Perrott .......................... 714/704 |
| 7,493,531 B2 | 2/2009 | Ito et al. |
| 8,161,331 B2* | 4/2012 | Bae et al. ....................... 714/700 |
| 2007/0011513 A1 | 1/2007 | Biswas et al. |
| 2009/0132888 A1 | 5/2009 | Bains et al. |
| 2010/0013454 A1* | 1/2010 | Dreps .......................... 323/364 |
| 2011/0119551 A1* | 5/2011 | Tsern et al. .................... 714/751 |
| 2012/0066559 A1* | 3/2012 | Chien et al. ................... 714/704 |

FOREIGN PATENT DOCUMENTS

| JP | 2006004557 | 1/2006 |
| JP | 2008546123 | 12/2008 |
| KR | 100656717 | 5/2006 |
| KR | 1020080011228 A | 1/2008 |
| KR | 1020090051715 A | 5/2009 |

* cited by examiner

*Primary Examiner* — Michael Maskulinski
(74) *Attorney, Agent, or Firm* — Muir Patent Consulting, PLLC

(57) ABSTRACT

A memory system includes an error detection circuit having an error counter. When a bit error rate (BER) determined by the error counter exceeds a reference BER, the memory system reduces the BER by adjusting its operating speed or operating voltage, re-performing data training or impedance matching, or by adjusting a data swing width. Accordingly, a method of controlling a bit error rate may be performed, and a system hang is prevented.

19 Claims, 5 Drawing Sheets

MEMORY SYSTEM AND METHOD FOR PREVENTING SYSTEM HANG

CROSS-REFERENCE TO RELATED APPLICATION

This application claims priority under 35 U.S.C. §119 to Korean Patent Application No. 10-2010-0019483 filed on Mar. 4, 2010, the disclosure of which is hereby incorporated by reference in its entirety.

BACKGROUND

1. Field

Embodiments of the inventive concept relate to a memory system, and more particularly, to a memory system employing cyclic redundancy check (CRC).

2. Description of Related Art

As the operating speeds of memory systems have increased, a probability of an error occurring during data transmission between a memory device and a memory controller constituting a memory system has also increased. Thus, when data transmission is performed between a memory device and a memory controller in recent memory systems, a specific code corresponding to data is generated and transmitted together with the data. And, the recent memory systems are gradually employing a CRC technique of analyzing the specific code applied together with data to correct a bit error that may occur in the data. The specific code generated to correspond to data to be transmitted is referred to as error check code (ECC). Apparatuses employing CRC transmit an ECC together with data, and analyze an ECC received together with data. When it is determined that a bit error is detected from the received data, the apparatuses request retransmission of the data, from which the error is detected, to correct the error. When the bit error rate (BER) of the data is high in this process, the retransmission request may be repeated for error correction. In particular, when the BER exceeds an error correction capability of a memory system, the system continuously repeats only a retransmission request, which results in a system hang.

SUMMARY

Embodiments of the inventive concept provide a memory system capable of preventing a system hang.

In accordance with one embodiment, a memory system is provided. The memory system includes at least one memory device configured to receive a clock signal and an operating voltage to operate, and a memory controller. The memory controller includes an error detection circuit having an error counter to determine bit error rate (BER) based on the number of bit errors occurring in data transmitted between the memory controller and the at least one memory device, and configured to output a first control signal to change the frequency of the clock signal when a determined BER exceeds a first reference BER.

In accordance with another embodiment, a memory system is provided. The memory system includes at least a first semiconductor memory unit configured to use a clock signal and an operating voltage to operate, and at least one error detection circuit configured to determine a bit error rate (BER) for the first semiconductor memory unit based on a number of bit errors per data transmitted. The memory system is configured to, in response to the BER reaching a threshold BER value, change at least one of a frequency of the clock signal and a voltage level of the operating voltage.

In accordance with another embodiment, a method of controlling a bit error rate (BER) in a memory system is disclosed. The method includes monitoring a bit error rate, determining if the bit error rate exceeds a first threshold value, and after it is determined that the bit error rate exceeds the first threshold value, performing one or more of: (1) lowering a frequency of a clock signal used for a semiconductor memory unit of the memory system, and (2) raising a voltage level of an operating voltage used in the semiconductor memory unit.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
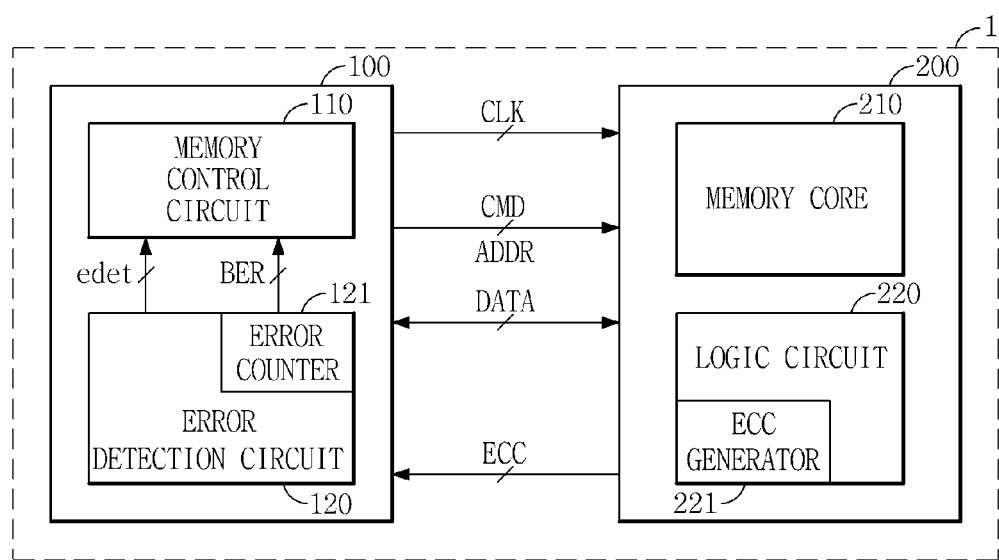
FIG. 1 is a block diagram of an exemplary memory system according to certain embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an exemplary block diagram of a memory system according to embodiments of the inventive concept. In FIG. 1, only a memory controller 100 and one memory device 200 are shown as a part of a memory system 1 for convenience. However, the memory system may include other elements, such as additional memory devices 200, additional control circuitry, etc. The memory device 200 may include, for example, a single semiconductor memory chip, a plurality of semiconductor chips arranged on a board, in a stack, or in another arrangement, a semiconductor memory package including one or more semiconductor memory chips, or a plurality of semiconductor memory packages arranged on a board, in a stack (i.e., package-on-package), or in another arrangement.

The memory controller 100 includes a memory control circuit 110 for controlling the memory device 200, and an error detection circuit 120 for detecting an error of data transmitted between the memory controller 100 and the memory device 200. The error detection circuit 120 has an error counter 121 for measuring the number of detected errors.

The memory device 200 receives a clock signal CLK from the memory controller 100 to operate, and includes a memory core 210 that has a plurality of memory cells (not shown) to store data and a logic circuit 220 that controls the memory core 210 in response to a command CMD applied from the memory controller 100.

The memory controller 100 applies the command CMD for controlling the memory device 200 to the memory device 200. When the applied command CMD is a read command or a write command, the memory controller 100 applies an address ADDR for selecting a specific memory cell together with the command CMD to the memory device 200. When the applied command CMD is a write command, the memory controller 100 additionally applies data DATA to be stored in selected memory cells of the memory device 200. Also, the memory controller 100 applies the clock signal CLK to the memory device 200.

Although not shown in the drawing, the memory controller 100 and the memory device 200 are supplied with power supply voltage to operate.

A cyclic redundancy check (CRC) method for data transmission between the memory controller 100 and the memory device 200 will be described below with reference to FIG. 1. First, in a read operation, the memory controller 100 applies a read command CMD together with an address ADDR to the memory device 200. The logic circuit 220 of the memory device receiving the address ADDR together with the read command CMD decodes the address ADDR and the read command CMD to select at least one memory cell corresponding to the address ADDR among the memory cells of the memory core 210, and receives data DATA stored in the selected memory cell. An error check code ECC generator 221 of the logic circuit 220 generates an error check code ECC in response to the data DATA applied from the memory core 210. When the error check code ECC is generated, the logic circuit 220 transmits the generated error check code ECC together with the applied data DATA to the memory controller 100.

The error detection circuit 120 of the memory controller 100 determines whether an error has occurred in the transmitted data DATA using the error check code ECC transmitted from the memory device 200 together with the data DATA. When it is determined that an error has occurred, the error detection circuit 120 outputs an error detection signal edet to the memory control circuit 110. When the error detection signal edet is applied, the memory control circuit 110 discards the transmitted data DATA because the data DATA has an error, and applies the read command CMD and the address ADDR to the memory device 200 again. In other words, the memory controller 100 requests the memory device 200 to read the same data again. When it is determined that an error has also occurred in the retransmitted data DATA like before, the memory controller 100 repeatedly requests retransmission until it is determined that correct data DATA has been received.

In a write operation, the memory controller 100 transmits data DATA together with a write command CMD and an address ADDR to the memory device 200. The logic circuit 220 of the memory device 200 receives the write command CMD, the address ADDR, and the data DATA, decodes the write command CMD and the address ADDR to select at least one memory cell corresponding to the address ADDR among the memory cells of the memory core 210, and stores the applied data DATA in the selected memory cell. The error check code generator 221 of the logic circuit 220 generates an error check code ECC in response to the data DATA applied from the memory controller 100, and the logic circuit 220 transmits the generated error check code ECC to the memory controller 100.

The error detection circuit 120 of the memory controller 100 analyzes the error check code ECC transmitted from the memory device 200 together with the transmitted data DATA to memory device 200, thereby determining whether or not an error has occurred in the data DATA received by the memory device 200. When it is determined that an error has occurred, the error detection circuit 120 outputs an error detection signal edet to the memory control circuit 110 as in the read operation. When the error detection signal edet is applied, the memory control circuit 110 outputs the write command CMD, the address ADDR, and the data DATA to the memory device 200 again. In other words, the memory controller 100 retransmits the same address ADDR and the same data DATA to the memory device 200, thereby requesting the memory device 200 to write the same data DATA again. When it is determined that an error has also occurred in the re-outputted data DATA like before, the memory controller 100 repeatedly requests rewrite until it is determined that correct data DATA has been written in the memory device 200. In one embodiment, the memory device 200 itself does not determine whether or not an error has occurred in the data DATA transmitted from the memory controller 100.

In one embodiment, the error counter 121 of the error detection circuit 120 counts the number of the error detection signals edet generated from the error detection circuit 120 regardless of the read or write operation of the memory device 200. In addition, the error counter 121 may count the number of the generated error detection signals edet with respect to the number of data bits transmitted between the memory controller 100 and the memory device 200 to measure a bit error rate (BER) between the two devices, and outputs the BER to the memory control circuit 110. The BER therefore indicates a number of bit errors per data bits transmitted (including data bits transferred to and from a memory device).

The memory control circuit 110 receives the BER from the error counter 121. In one embodiment, when the applied BER reaches a first reference BER (e.g. equals and/or exceeds a threshold BER value), the memory control circuit 110 changes the frequency of the clock signal CLK and outputs the clock signal CLK, or generates and outputs a first mode change command MCC1 to the memory device 200. When the first mode change command MCC1 is applied, the memory device 200 performs a dynamic voltage frequency scaling (DVFS) operation of adjusting the level of an operating voltage and/or an operating frequency in response to the first mode change command MCC1.

In one embodiment, the first reference BER may have a value that is equal to or smaller than a maximum permissible BER designated for the memory system 1. In general, when the memory system 1 is designed, a permissible BER (e.g., $10^{-4}$) is set. When errors occur at a BER that is equal to or less than the permissible BER during data transmission, the memory system 1 can normally operate through an error correction operation without a system hang. Thus, when the first reference BER is equal to or less than the maximum permissible BER set to the memory system 1 and bit errors occur at the first reference BER or less during data transmission in the memory system 1, the memory system 1 can normally operate (e.g., operate according to system specifications and without a system hang).

Figure 2:
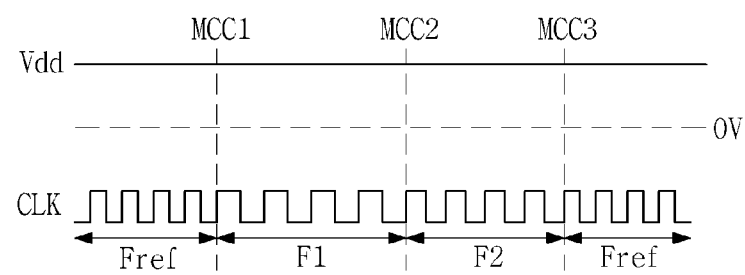
FIGS. 2 through 4 are exemplary timing diagrams illustrating a dynamic voltage frequency scaling (DVFS) operation, according to certain embodiments.
Figure 3:
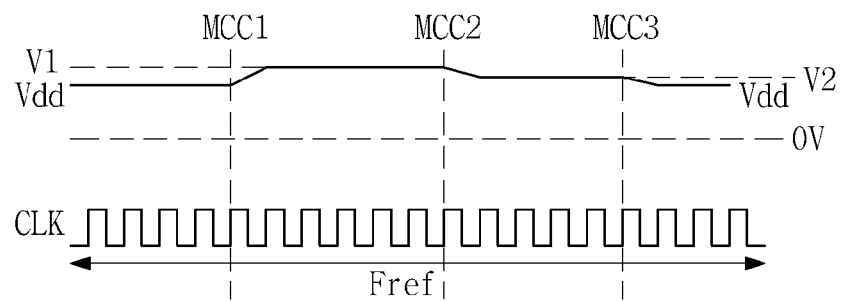
Figure 4:
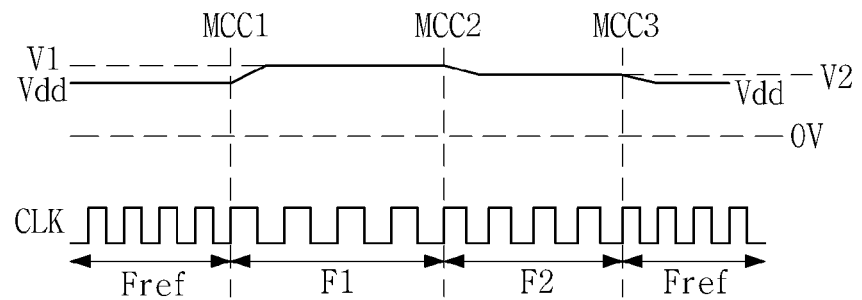

FIGS. 2 through 4 are exemplary timing diagrams illustrating a DVFS operation, according to certain embodiments. An operating frequency is adjusted in FIG. 2, an operating voltage is adjusted in FIG. 3, and both of an operating frequency and an operating voltage are adjusted in FIG. 4.

During data transmission in the memory system 1, an error mainly occurs due to temperature, voltage, and frequency. Thus, by adjusting a temperature, voltage, and frequency, it is possible to adjust a rate at which an error occurs during data transmission. DVFS is a technique suggested to improve the stability of a memory system and reduce the power consumption by adjusting a voltage and frequency. To be specific, in one embodiment, the memory device 200 raises the operating voltage of the memory device 200 to a first voltage level in response to the first mode change command MCC1, and/or lowers the operating frequency to a first frequency in response to the clock signal CLK that is changed and applied. As such, the first voltage level is higher than the voltage level of the normal operating voltage (reference operating voltage) of the memory device 200, and the first frequency is lower than the normal operating frequency (reference operating frequency) of the memory device 200.

In general, when devices constituting a system are designed, a reference operating voltage and reference operating frequency are set. However, in many situations, the actual system cannot operate at the accurate reference operating voltage and reference operating frequency due to a variety of factors. Thus, the respective devices of the system permit an error within a predetermined range from the reference operating voltage and the reference operating frequency. In other words, even if an operating voltage and an operating frequency are changed within the permitted error range, each of the devices can normally operate.

Accordingly, in response to the clock signal CLK, the memory device 200 receiving the first mode change command MCC1 may reduce an operating frequency as shown in FIG. 2, increase an operating voltage as shown in FIG. 3, and both lower the operating frequency and raise the operating voltage as shown in FIG. 4. The memory controller 100 and the memory device 200 operate using the clock signal CLK as a reference. Thus, when the memory controller 100 changes the frequency of the clock signal CLK from a reference frequency Fref to a first frequency F1, the overall operating speed of the memory device 200 also decreases. As a result, the overall operating speed of the memory system 1 decreases. Because of the lower operating speed, during data transmission, an additional margin is ensured in a data valid window, and a BER is reduced. Also, as the overall operating speed of the memory system 1 decreases, the temperature of the memory device 200 lowers. Here, the first frequency F1 may have as low a frequency as possible within a range permitted by the memory system 1. For example, the memory device may have specifications indicating a minimal clock frequency permitted for the device to operate properly.

With the reduction in the operating speed of the memory system 1, the temperature lowers, and data transmission can be stably performed. Thus, a BER is reduced, so that a system hang can be prevented. After this, in one embodiment, when the BER is reduced to a second reference BER or less, the memory controller 100 may change the frequency of the clock signal CLK to a second frequency F2 that is higher than the first frequency F1 and lower than the reference frequency Fref, and may apply a second mode change command MCC2 to the memory device 200. The memory device 200 then operates in response to the clock signal CLK having the second frequency F2. After this, when the BER is kept at the second reference BER or less even if the frequency of the clock signal CLK is changed to the second frequency F2, the memory controller 100 may apply a third mode change command MCC3 to the memory device 200 to change the frequency of the clock signal CLK back to the reference frequency Fref to allow the memory system 1 to operate again at its desired frequency Fref. In other words, when the BER reaches the first reference BER, the frequency of the clock signal CLK is lowered to the first frequency F1, and then when the BER is reduced to the second reference BER or less, the frequency of the clock signal CLK is raised to the second frequency F2 and then the reference frequency Fref. Thus, the system is designed to permit recovery back to the original, faster data rate after correcting for BER.

When the BER of the memory system 1 exceeds the first reference BER, the BER may exceed a BER permitted by the memory system 1, and a system hang may occur. If the frequency of the clock signal CLK is lowered to only a little less than the reference frequency Fref when the BER of the memory system 1 exceeds the first reference BER, the margin (i.e., size) of a data valid window will likely not change much, and the temperature is likely to be kept high. As a result, a system hang may still occur. Accordingly, in one embodiment, when the BER of the memory system 1 exceeds the first reference BER, the first frequency F1 is set as low as possible within a range permitted by the memory system 1 (e.g., within a range designated by system specifications that allow the memory system 1 to operate properly) to prevent a system hang. When the frequency of the clock signal CLK is changed to the first frequency F1, a system hang can be prevented as much as possible. Since the first frequency F1 is lower than the reference frequency Fref, when the frequency of the clock signal CLK becomes the first frequency F1, the operating speed of the memory device 200 decreases, and the temperature is lowered. As a result, a system hang can be further prevented. After this, if the frequency of the clock signal CLK is changed to the second frequency F2 and then to the reference frequency Fref while the BER of the memory system 1 is checked, it is possible to restore the memory system 1 to the normal operating speed while preventing a system hang.

Thus, the memory controller 100 may subdivide the process of restoring the frequency of the clock signal CLK from the first frequency F1 to the reference frequency Fref in a repeated, step-wise manner. Also, although it has been described above that the clock signal CLK used to operate the memory device 200 is applied from the memory controller 100 to the memory device 200, the clock signal CLK may instead be generated by the memory device 200. In this case, the memory controller 100 may output a plurality of mode change commands to adjust the frequency of the clock signal CLK generated by the memory device 200.

In FIG. 3, when the first mode change command MCC1 is applied, the memory device 200 raises the operating voltage from a reference voltage Vdd to a first voltage V1. The memory device 200 may receive a power supply voltage to generate the operating voltage. Like with the first frequency F1, the first voltage V1 may be raised to a level as high as possible within a range permitted by the memory system 1. When the voltage level of the memory device 200 is raised to the first voltage V1, a transition speed of gates in the memory device 200 may be increased, thereby decreasing error rates, and a system hang can be prevented similarly to if the frequency of the clock signal CLK were lowered. In one embodiment, the first voltage level is a maximum operating voltage at which the memory device can operate according to its specifications. When the second mode change command MCC2 and a third mode change command MCC3 are applied, the memory device 200 sequentially lowers the level of the operating voltage to the levels of a second voltage V2 and the reference voltage Vdd that are lower than that of the first voltage V1.

In one embodiment, the memory controller 100 may further subdivide the process of applying an additional mode change commands to the memory device 200 to restore the voltage level of the operating voltage from the first voltage V1 to the reference voltage Vdd (e.g., by applying a plurality of mode change commands to gradually lower the operating voltage back to the reference voltage Vdd over a series of mode changes).

Although it has been described with reference to FIG. 2 or 3 that only the operating speed or operating voltage of the memory system 1 is adjusted, the operating speed and the operating voltage of the memory system 1 are typically related to each other. For example, when the voltage level of the operating voltage is raised, the turn-on and turn-off speeds of gates in the memory controller 100 or the memory device 200 increase, and as a result, transition speeds of gates increase, thereby reducing errors. Thus, DVFS of lowering both of the operating speed and the operating voltage is illustrated in FIG. 4. In FIG. 4, the operating speed adjustment method of FIG. 2 and the operating voltage adjustment method of FIG. 3 are used in parallel, and thus FIG. 4 will not be described separately.

Although it has been described above that the memory controller 100 controls the one memory device 200, there may be a plurality of memory devices 200 controlled by the controller 100. Also, although it has been described that the error counter and error detection circuit are located at the controller, certain of these elements can alternatively be located at the one or more memory devices 200, such that certain error checking functions occur at the one or more memory devices 200.

Figure 5:
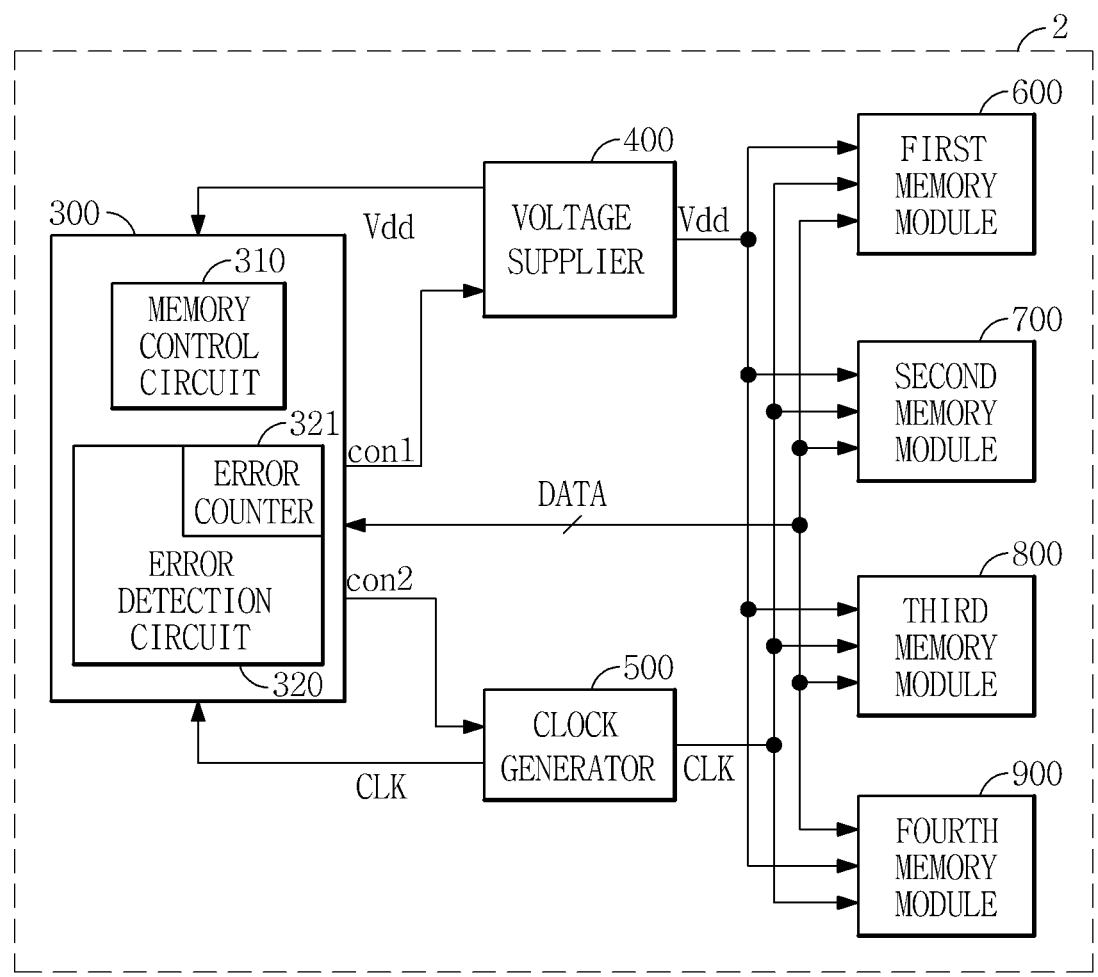
FIG. 5 is a block diagram of an exemplary memory system according to other embodiments of the inventive concept.

FIG. 5 is a block diagram of an exemplary memory system according to other embodiments of the inventive concept. A memory system 2 includes a memory controller 300, a voltage supplier 400, a clock generator 500, and a plurality of memory modules 600, 700, 800 and 900. The memory modules can include, for example, a board having a plurality of semiconductor memory chips arranged thereon. Each module can have its own BIOS ROM, and each may include, for example, a plurality of single chips, a plurality of packages that each include a plurality of chips, or a plurality of package-on-package devices. Hereinafter, a semiconductor memory chip, semiconductor memory package, package-on-package semiconductor memory device, and semiconductor memory module can each be referred to as a semiconductor memory unit.

In FIG. 5, the memory controller 300 has an error detection circuit 320, like the memory controller 100 of FIG. 1, and applies a first control signal con1 to the voltage supplier 400 and a second control signal con2 to the clock generator 500. Also, although not shown in the drawing, the memory controller 300 may apply control signals to the respective memory modules 600 to 900 to control operation of the entire memory system 2. The error detection circuit 320 of the memory controller 300 has an error counter 321, and applies the first control signal for adjusting the operating voltage level of the memory system 2 to the voltage supplier 400 or the second control signal con2 for adjusting the operating speed of the memory system 2 to the clock generator 500 in response to a BER determined by the error counter 321.

In one embodiment, the voltage supplier 400 is configured to adjust the voltage level of the operating voltage to first and second voltages V1 and V2 in response to the first control signal con1, as illustrated in FIGS. 3 and 4, and to supply the operating voltage to the memory modules 600 to 900 and the memory controller 300. In addition, the clock generator 500 is configured to adjust the frequency of a clock signal CLK to first and second frequencies F1 and F2 in response to the second control signal con2, as illustrated, for example, in FIGS. 2 and 4, and supplies the operating frequency to the memory modules 600 to 900 and the memory controller 300.

The memory modules 600 to 900 operate in response to the operating voltage applied from the voltage supplier 400 and the clock signal CLK applied from the clock generator 500. Also, the memory controller 300 receives the operating voltage and the clock signal CLK.

In other words, the memory system 2 of FIG. 5 performs a DVFS operation when the memory controller 300 applies the first control signal con1 to the voltage supplier 400 and the second control signal con2 to the clock generator 500. Since the DVFS operation of the memory system 2 of FIG. 5 may be the same as the DVFS operations illustrated in FIGS. 2-4, the description will not be reiterated.

Although it has been described with reference to FIG. 5 that only the memory controller 300 has the error detection circuit 320, each of the memory modules 600 to 900 may have the error detection circuit 320 and the error check code generator 221 of FIG. 1. When each of the memory modules 600 to 900 has the error detection circuit 320, each of the memory modules 600 to 900 may generate and supply the first and second control signals con1 and con2 to the voltage supplier 400 and the clock generator 500.

Each of the memory modules 600 to 900 of FIG. 5 may be different. That is, the memory modules 600 to 900 need not include the same arrangement of chips, but each can have different numbers or arrangements of memory devices.

Figure 6:
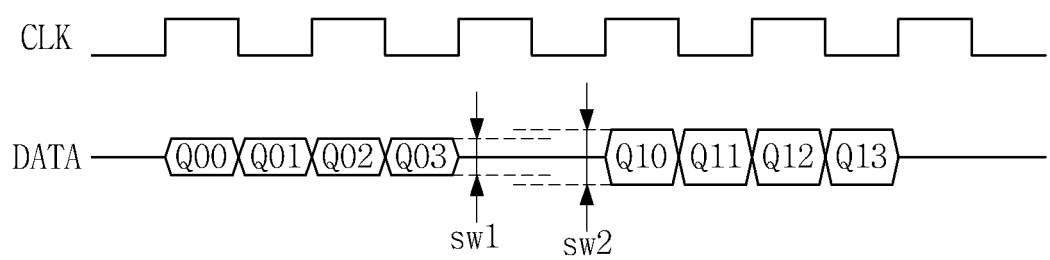
FIG. 6 is an exemplary timing diagram illustrating another method for preventing a system hang, according to certain embodiments.

FIG. 6 is an exemplary timing diagram illustrating another method for preventing a system hang, according to certain embodiments.

A system hang may occur under various conditions, or may be caused by repeated retransmission requests during CRC as described above. A case where there is no response from a memory system for a predetermined time period (e.g., five seconds) or more may be defined as a system hang, and the predetermined time period may vary according to the system.

Thus, to prevent a system hang caused by data retransmission requests in a memory system employing CRC, data needs to be transmitted at an error rate within a BER that can be corrected by the memory system. In other words, when data is normally transmitted, a data retransmission request can be prevented from being generated by CRC, thus preventing a system hang.

Accordingly, a method of adjusting the swing width of transmitted data is illustrated in FIG. 6. Some memory systems that transmit data at high speed adjust the voltage swing width of data using an impedance matching technique so that the transmitted data is not reflected or distorted. However, even if an impedance matching technique is employed, reflection or distortion may occur during data transmission with a change in the use environment of the memory systems, such as temperature, operating voltage, and operating speed. In certain embodiments, when a BER becomes a first reference BER, an impedance matching operation may be performed again to prevent a system hang resulting from repeated data retransmission requests caused by CRC. Alternatively, or additionally, the swing width of the transmitted data may be increased for data transmission to reduce errors. If the swing width of transmitted data is increased when a memory system normally transmits the data, reflection and distortion increase, and a BER may increase. However, when a current BER is high, it may be determined that impedance matching has not been performed. In this case, by re-performing impedance matching, reflection and distortion may be decreased while the signal strength of transmitted data increases due to larger voltage swing width, and the data is more likely to be transmitted without an error.

Accordingly, as illustrated in FIG. 6, the swing width of data is increased from a first level sw1 to a second level sw2 so that data requested for retransmission can be normally transmitted, and a system hang can be prevented.

Figure 7:
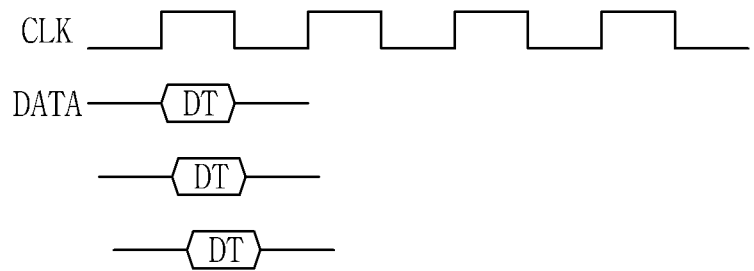
FIG. 7 is an exemplary timing diagram illustrating still another method for preventing a system hang, according to certain embodiments.

FIG. 7 is an exemplary timing diagram illustrating another method for preventing a system hang, that is, a data training method.

A memory system that transmits data at high speed provides a data training method for further precisely adjusting a data transmission time as well as the above-mentioned impedance matching technique. In the data training method, test data for training is transmitted while the phase of the test data is being adjusted with respect to a clock signal CLK to find an optimum timing for data transmission. Thus, when a BER becomes a first reference BER, a system hang may be prevented by performing a data training operation again to reset the data transmission timing.

As illustrated in FIGS. 6 and 7, a memory system according to embodiments of the inventive concept has an error counter to determine a BER during data transmission, and performs data training and impedance matching and changes a data swing width on the basis of the determined BER to reduce the BER, thereby preventing a system hang. The impedance matching technique, the data swing width adjustment method, and the data training method illustrated in FIGS. 6 and 7 may be employed together with the operating speed adjustment method and the operating voltage adjustment methods illustrated in FIGS. 2 to 4. In particular, since the data training method transmits test data while adjusting the phase of the test data with respect to the clock signal CLK, it is possible to greatly reduce a BER by employing the data training method together with the operating speed adjustment method of lowering the frequency of the clock signal CLK.

Additionally, when a BER increases to a first reference BER during data transmission between the memory controller 100 or 300 and the memory device 200 or the memory modules 600 to 900, CRC may be temporarily stopped to prevent a system hang. When the memory device 200 is a graphic memory device or the memory modules 600 to 900 are graphic memory modules, graphic data is transmitted. In general, a very large amount of graphic data is transmitted between a graphic memory device and a memory controller. Thus, even if an error occurs in a part of the data, the error of some bits does not have much influence on an entire image. Furthermore, due to a feature of graphic data output as an image, a time for which data including the bits where the error has occurred is output is very short. Thus, when the memory device 200 is a graphic memory device, a system hang caused by CRC results in a more serious damage to the memory system in comparison with a data error. For this reason, a system according to embodiments of the inventive concept may temporarily stop CRC to prevent a system hang when the BER of data transmitted between the memory controller 100 or 300 and the memory device 200 or the memory modules 600 to 900 increases to a first reference BER.

Although it has been described above that an error detection circuit having an error counter is prepared in the memory controller 100 or 300, the error detection circuit may be prepared as a separate device and included in the memory device 200 or the memory modules 600 to 900. Even if the error detection circuit is prepared as a separate device or included in another device, the error counter of the error detection circuit may measure a BER and output a variety of control signals for preventing a memory system hang.

Figure 8:
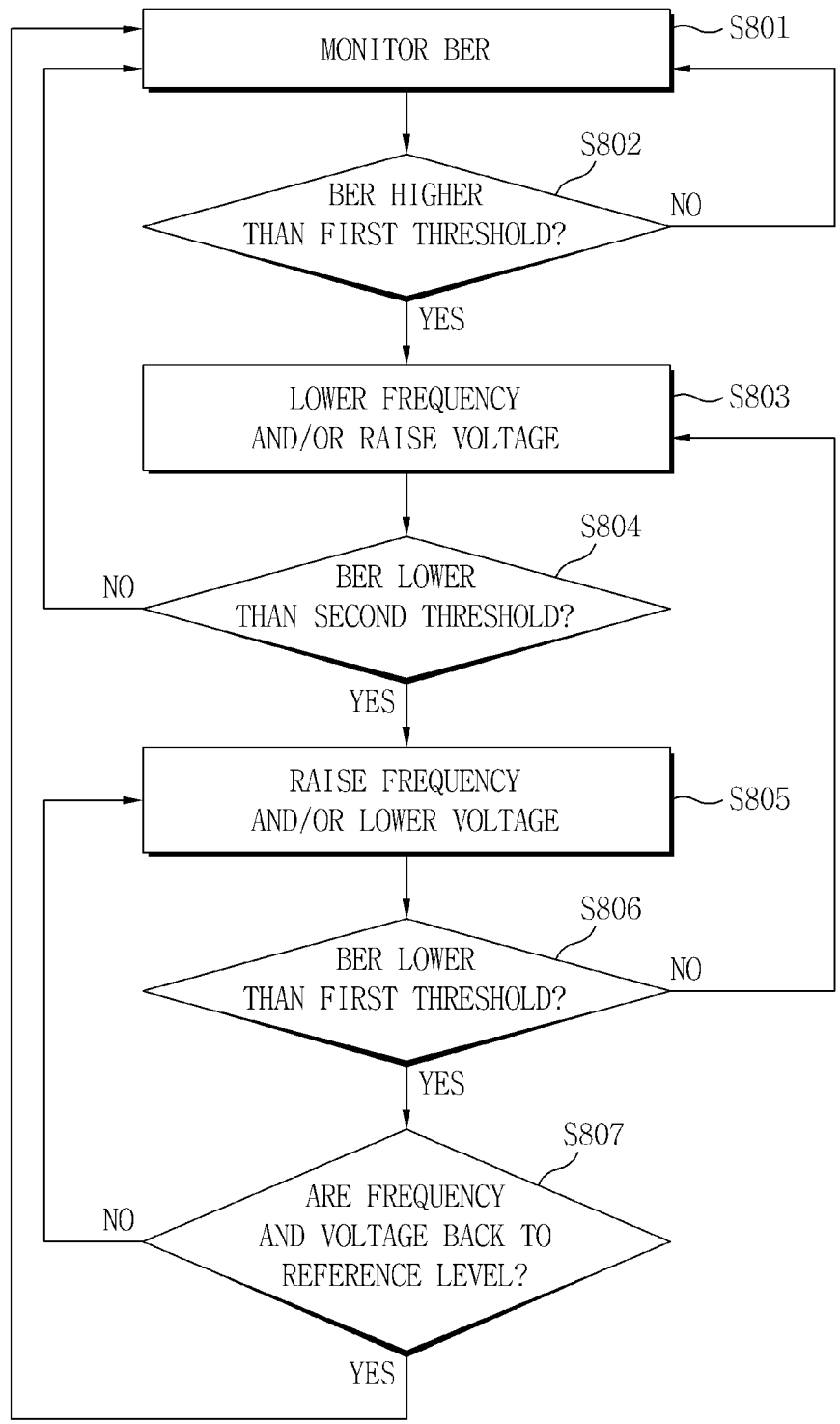
FIG. 8 is a flow chart describing an exemplary method carried out by a semiconductor system, according to certain embodiments.

FIG. 8 is a flow chart describing an exemplary method 800 carried out by a semiconductor system, according to certain disclosed embodiments.

In step 801, a bit error rate is monitored. For example, a bit error rate of a semiconductor memory unit, such as a memory device or memory module can be monitored using an error detection circuit and error counter as described in connection with FIGS. 1 and 5.

In step 802, it is determined if the bit error rate is higher than a first threshold. For example, the first threshold may be set to a value that corresponds with a maximum permissible bit error rate of a semiconductor memory unit, based on a design specification or other criteria.

If the bit error rate is lower than a first threshold (802, no), then the method returns to step 801 to monitor the bit error rate. If the bit error rate is higher than a first threshold (802, yes), then one of more of the techniques discussed above for decreasing the error rate may be applied. For example, a clock frequency of the semiconductor memory unit may be lowered from a reference clock frequency to a first clock frequency lower than the reference clock frequency, and/or an operating voltage of the semiconductor memory unit may be raised from a reference voltage level to a first voltage level higher than the reference voltage level.

In step 804, it is determined whether the bit error rate is lower than a second threshold. For example, the second threshold may be a value that is lower than the first threshold, and may be a value significantly lower to ensure that a system hang no longer occurs.

If the bit error rate is higher than the second threshold (804, no), then the method returns to step 801 to monitor the bit error rate. However, if the bit error rate is lower than the second threshold (804, yes), then in step 805, a clock frequency of the semiconductor memory unit may be increased and/or an operating voltage may be decreased. In one embodiment, the clock frequency can be increased to a second frequency higher than the first frequency but lower than the reference frequency, and/or the operating voltage can be decreased to a second voltage level lower than the first voltage level but higher than the reference voltage level.

In step 806, it is again determined whether the bit error rate is lower than the first threshold. If it is not lower (i.e., it exceeds the threshold) (806, no), then a system hang may be about to occur, so the method returns to step 803 and performs one or more techniques to lower the bit error ratio. If it is lower (806, yes), then the system determines whether the clock frequency and/or operating voltage have returned to their reference levels (step 807). If either one has, then in one embodiment, that value is no longer changed. However, if one or both of the clock frequency or operating voltage has not returned to its reference level, then the method returns to step 805, where the clock frequency and/or operating voltage are further adjusted. This loop including steps 805-807 may repeat until both of the clock frequency and operating voltage have returned to their reference levels, at which point (step 807, yes), the method returns to step 801, where the bit error rate is monitored.

As a result of the method 800, the memory system may operate at a most efficient data rate while minimizing the likelihood that a system hang will occur as a result of error detection and correction.

As described above, a memory system according to embodiments of the inventive concept includes an error detection circuit having an error counter, and lowers the temperature of the system by adjusting the operating speed of the system or reduces a BER determined by the error counter by adjusting the operating speed and operating voltage of the system, or performing data training or impedance matching again or by adjusting a data swing width when the BER that determined by the error counter becomes a reference BER that is set by system. Consequently, a system hang is prevented.

The above embodiments are applicable to various different types of memory systems that employ error correction. Exemplary memory systems include DRAM, SRAM, PRAM, or NAND flash, for example.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A memory system, comprising:
at least one memory device configured to receive a clock signal and an operating voltage to operate; and
a memory controller including an error detection circuit having an error counter to determine a bit error rate (BER) based on the number of bit errors occurring in data transmitted between the memory controller and the at least one memory device, and configured to output a first control signal to change a frequency of the clock signal when a determined BER exceeds a first reference BER,
wherin the first reference BER is equal to or less than a maximum permissible BER designated for the system,
wherein the memory controller is further configured to output a second control signal for raising a voltage level of the operating voltage when the measured BER exceeds the first reference BER,
wherein the operating voltage has a level of a reference voltage when the system normally operates, and has a first voltage level higher than the level of the reference voltage in response to the second control signal, and
wherein the memory controller is further configured to output a third control signal that causes the operating voltage to have a second voltage level lower than the first voltage level and higher than the level of the reference voltage when the operating voltage has the first voltage level and the measured BER is a second reference BER less than the first reference BER.

2. The memory system according to claim 1, wherein the clock signal has a reference frequency when the system normally operates, and has a first frequency lower than the reference frequency in response to the first control signal.

3. The memory system according to claim 2, wherein the memory controller is configured to change the frequency of the clock signal to a second frequency higher than the first frequency and lower than the reference frequency when the clock signal has the first frequency and BER is a second reference BER less than the first reference BER.

4. The memory system according to claim 3, further comprising a clock generator configured to adjust the frequency of the clock signal in response to the first control signal and to further adjust the frequency of the clock signal in response to a forth control signal, and to apply the clock signal to the at least one memory device.

5. The memory system according to claim 1,further comprising a voltage supplier configured to adjust the voltage level of the operating voltage in response to the second and third control signals and apply the operating voltage to the at least one memory device.

6. The memory system according to claim 1, wherein the memory controller is further configured to output a fifth control signal instructing data training to be performed for the at least one memory device when the measured BER exceeds the first reference BER.

7. The memory system according to claim 1, wherein the memory controller is further configured to output a sixth control signal for increasing a swing width of the data transmitted to or from the at least one memory device when the measured BER exceeds the first reference BER.

8. The memory system according to claim 1, wherein when the measured BER exceeds the first reference BER, the memory controller outputs a seventh control signal instructing impedance matching to be performed with the at least one memory device.

9. The memory system according to claim 1, wherein when the at least one memory device is a graphic memory device and the measured BER exceeds the first reference BER, the error detection circuit stops an error detection operation for the transmitted data.

10. The memory system according to claim 1, wherein each of the at least one memory device has an error check code generator configured to generate an error check code for determining whether or not an error has occurred in transmitted data.

11. The memory system according to claim 1, wherein each of the at least one memory device has the error detection circuit.

12. A method of controlling a bit error rate (BER) in a memory system, the method comprising:
 (a) monitoring a bit error rate;
 (b) determining if the bit error rate exceeds a first threshold value;
 (c) after it is determined that the bit error rate exceeds the first threshold value, performing one or more of: (1) lowering a frequency of a clock signal used for a semiconductor memory unit of the memory system, and (2) raising a voltage level of an operating voltage used in the semiconductor memory unit, wherein step (c) further comprises, after it is determined that the bit error rate exceeds the first threshold value, lowering the frequency of the clock signal to a first frequency less than a reference frequency used prior to lowering the frequency;
 (d) after the frequency of the clock signal is lowered to the first frequency, determining if the bit error rate is lower than a second threshold value less than the first threshold value;
 (e) if it is determined that the bit error rate is lower than the second threshold value, then increasing the frequency of the clock signal to a second frequency higher than the first frequency but lower than the reference frequency;
 (f) repeatedly determining whether the bit error rate is lower than the first threshold value; and
 (g) so long as the bit error rate is lower than the first threshold value, incrementally increasing the frequency of the clock signal until it reaches the reference frequency.

13. The method of claim 12, wherein:
 the first threshold value is a maximum permissible bit error rate set for the semiconductor memory unit; and
 the first frequency is a minimum frequency at which the semiconductor memory unit can operate according to its specifications.

14. The method of claim 12, wherein step (c) further comprises:
 after it is determined that the bit error rate exceeds the first threshold value, raising the voltage level of the operating voltage to a first voltage level greater than a reference voltage level used prior to raising the operating voltage.

15. The method of claim 12, wherein:
 the semiconductor memory unit is one of a semiconductor memory chip, semiconductor memory package, package-on-package semiconductor memory device, and semiconductor memory module.

16. A method of controlling a bit error rate (BER) in a memory system, the method comprising:
 (a) monitoring a bit error rate;
 (b) determining if the bit error rate exceeds a first threshold value;
 (c) after its is determined that the bit error rate exceeds the first threshold value, performing one or more of: (1) lowering a frequency of a clock signal used for a semiconductor memory unit of the memory system, and (2) raising a voltage level of an operating voltage used in the semiconductor memory unit, wherein step (c) futher comprises, after it is determined that the bit error rate exceeds the first threshold value, raising the voltage level of the operating voltage to a first voltage level greater than a reference voltage level used prior to raising the operating voltage;
 (d) after the operating voltage is raised to the first voltage level, determining if the bit error rate is lower than a second threshold value less than the first threshold value; and
 (e) if it is determined that the bit error rate is lower than the second threshold value, then decreasing the operating voltage to a second voltage level lower than the first voltage level but higher than the reference voltage level.

17. The method of claim 16, further comprising:
 (f) repeatedly determining whether the bit error rate is lower than the first threshold value; and
 (g) so long as the bit error rate is lower than the first threshold value, incrementally decreasing the operating voltage until it reaches the reference voltage level.

18. The method of claim 16, wherein:
 the first threshold value is a maximum permissible bit error rate set for the semiconductor memory unit; and
 the first voltage level is a maximum operating voltage at which the semiconductor memory unit can operate according to its specifications.

19. The method of claim 16, wherein:
 the semiconductor memory unit is one of a semiconductor memory chip, semiconductor memory package, package-on-package semiconductor memory device, and semiconductor memory module.

* * * * *